(12) United States Patent
Di Risio et al.

(10) Patent No.: US 9,198,327 B2
(45) Date of Patent: Nov. 24, 2015

(54) VOLTAGE REGULATOR FOR AN ALTERNATOR

(75) Inventors: Giammarco Di Risio, Casalbordino (IT); Mario Piluso, San Salvo (IT); Rocco Miccoli, Francavilla al Mare (IT); Nicola Fizzano, Vasto (IT)

(73) Assignee: Denso Manufacturing Italia S.P.A., San Salvo (Chieti) (IT)

( * ) Notice: Subject to any disclaimer, the term of this patent is extended or adjusted under 35 U.S.C. 154(b) by 222 days.

(21) Appl. No.: 14/009,792

(22) PCT Filed: Apr. 5, 2012

(86) PCT No.: PCT/IB2012/051687
§ 371 (c)(1),
(2), (4) Date: Oct. 3, 2013

(87) PCT Pub. No.: WO2012/137162
PCT Pub. Date: Oct. 11, 2012

(65) Prior Publication Data
US 2014/0022729 A1    Jan. 23, 2014

(30) Foreign Application Priority Data

Apr. 6, 2011    (IT) .............................. TO2011A0312

(51) Int. Cl.
*H02K 19/36*    (2006.01)
*H05K 7/20*    (2006.01)
(Continued)

(52) U.S. Cl.
CPC ............ *H05K 7/2039* (2013.01); *H02K 11/024* (2013.01); *H02K 19/365* (2013.01); *H02K 5/225* (2013.01)

(58) Field of Classification Search
CPC .................................................. H02K 19/365
See application file for complete search history.

(56) References Cited

U.S. PATENT DOCUMENTS 6,535,392 B2 *   3/2003   Yamamoto et al. ........... 361/728
7,215,049 B2 *   5/2007   Sakurai .......................... 310/64
(Continued)

FOREIGN PATENT DOCUMENTS

EP          0731550 A2      9/1996

OTHER PUBLICATIONS

International search report for application No. PCT/IB2012/051687 dated Jun. 25, 2012.

*Primary Examiner* — Robert J Hoffberg
(74) *Attorney, Agent, or Firm* — Patterson & Sheridan, LLP

(57) ABSTRACT

Voltage regulator, in particular for an alternator, comprising a connector designed to perform the function of a communication interface between the alternator and a control unit of an engine to which the alternator is connected; a capacitor designed to be connected to the alternator, for performing the function of an anti-noise filter at radio frequencies; a processing module designed to be connected to the alternator, for managing operation thereof; a heat sink designed to dissipate the heat of the regulator; the regulator wherein it comprises a casing which is designed to be connected to the alternator and defines a main cavity designed to house the connector and a secondary cavity which is adjacent to the main cavity and designed to house the capacitor; the casing is able to be fixed to the alternator by means of four mechanical connection elements, two of said connection elements being connected to the capacitor, a third one being connected and screwed to a brush holder of the alternator and a fourth one being connected to the processing module; the processing module is connected to the connector by means of a conductor and is connected to the four mechanical connection elements; and the heat sink is fixed to the processing module.

5 Claims, 9 Drawing Sheets

(51) Int. Cl.
*H02K 11/02* (2006.01)
*H02K 5/22* (2006.01)

(56) References Cited

U.S. PATENT DOCUMENTS

| | | | |
|---|---|---|---|
| 7,362,019 B2 * | 4/2008 | Hamada et al. | 310/68 D |
| 7,387,551 B2 * | 6/2008 | Kurahashi | 439/76.1 |
| 7,538,522 B2 * | 5/2009 | Lybbert | 322/28 |
| 7,652,400 B2 * | 1/2010 | Oohashi | 310/68 D |
| 7,656,134 B2 * | 2/2010 | Lybbert | 322/28 |
| 8,022,585 B2 * | 9/2011 | Oohashi | 310/68 D |
| 8,193,667 B2 * | 6/2012 | Oohashi | 310/68 D |
| D726,111 S * | 4/2015 | Tanaka et al. | D13/124 |
| 2008/0054856 A1 | 3/2008 | Lybbert | |
| 2010/0133961 A1 | 6/2010 | Shirakata et al. | |

* cited by examiner

VOLTAGE REGULATOR FOR AN ALTERNATOR

The present invention relates to a voltage regulator for an alternator, in particular for a motor-vehicle engine.

More specifically, the present invention relates to a voltage regulator of the type defined in the preamble of claims.

Voltage regulators comprising a processing module designed to manage operation of the alternator on which they are mounted are known.

These regulators are often bulky and composed of a plurality of bodies or cases which are interconnected and each include a different component of the regulator, such as the processing module, the heat sink, etc.

The object of the present invention is therefore to propose a voltage regulator which is compact and which has small dimensions.

This and other objects are achieved with the voltage regulator, whose characteristics are defined in claims.

Particular embodiments form the subject of the dependent claims, the content of which is to be understood as forming an integral and integrating part of the present description.

Further characteristics and advantages of the invention will become clear from the following detailed description provided purely by way of a non-limiting example, with reference to the accompanying drawings in which.

Figure 1:
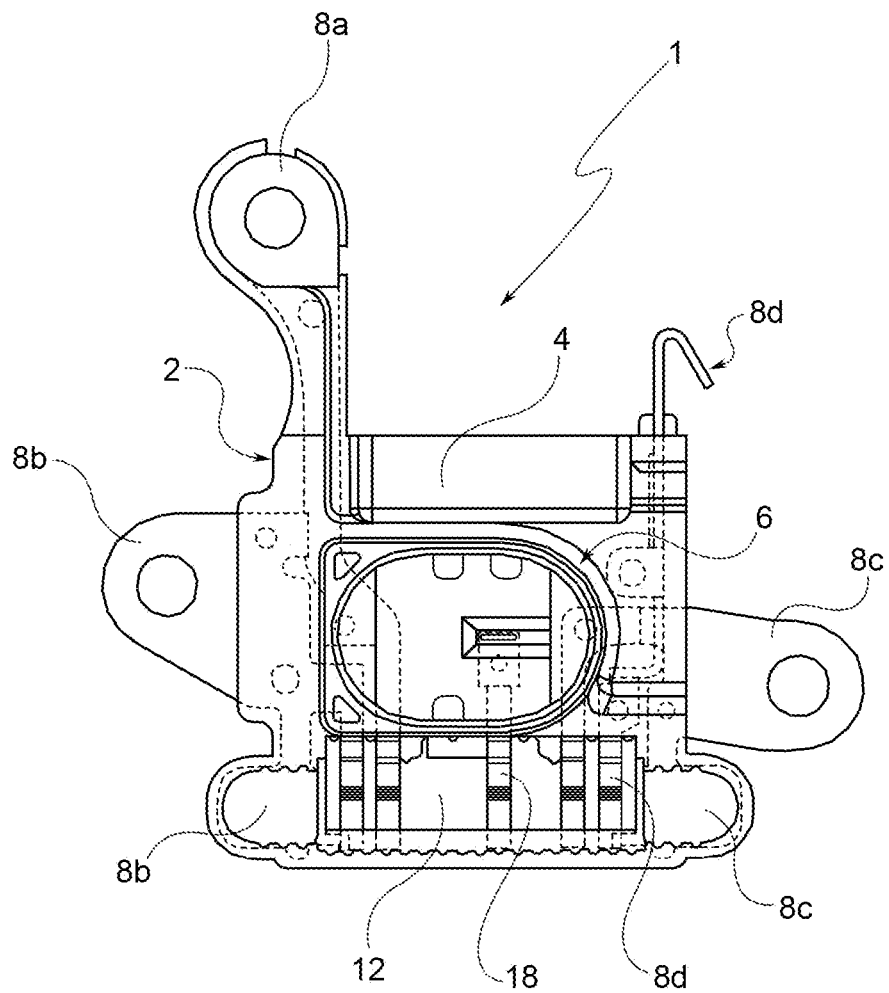
FIG. 1 is a top plan view of a voltage regulator according to the present invention.
Figure 8:
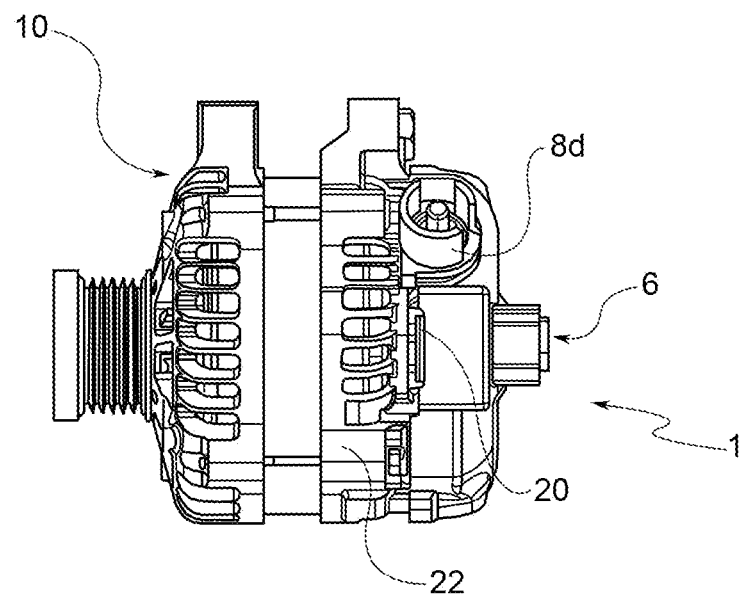
FIG. 8 is a side view of the regulator mounted on an alternator.

FIG. 1 shows a voltage regulator 1 which comprises a casing 2 which defines a main cavity 4 designed to house a connector 6 designed, in a manner known per se, to perform the function of a communication interface between an alternator 10 shown in FIG. 8 and a control unit of an engine to which the alternator is connected.

Four mechanical connection elements 8a, 8b, 8c and 8d are fixed to the casing 2 and are able to allow fixing of the casing 2 itself (and therefore the regulator 1) to the alternator 10.

Figure 2:
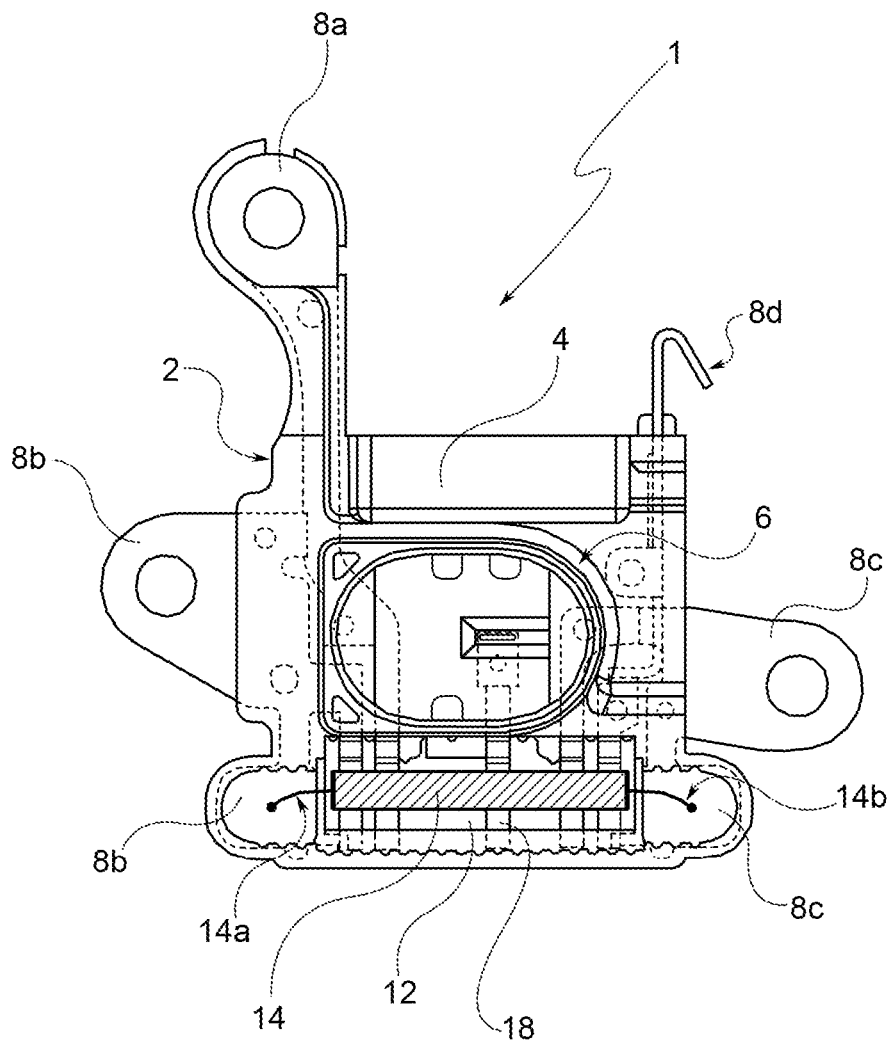
FIG. 2 is the same top plan view as in FIG. 1, comprising also the capacitor.

A secondary cavity 12 adjacent to the main cavity 4 and designed to house a capacitor 14 is also defined inside the casing 2 as shown in FIG. 2.

The capacitor 14 performs in a manner known per se the function of an anti-noise filter at radio frequencies. The capacitor 14 is connected by means of respective terminals (rheophores) 14a and 14b to the mechanical connection elements 8b and 8c which also perform the function of electrical connections since they are made of conductive material such as for example tin-plated steel. The terminal elements 8a and 8d also perform the electrical connection function.

The terminal element 8a is connected and screwed to a brush holder element of the alternator 10.

The terminal element 8d is designed to be electrically welded to a terminal of a rectifier bridge mounted in a manner known per se on the alternator 10. The terminal element 8d is connected, on the other hand, only to a processing module 16 described below.

Figure 3:
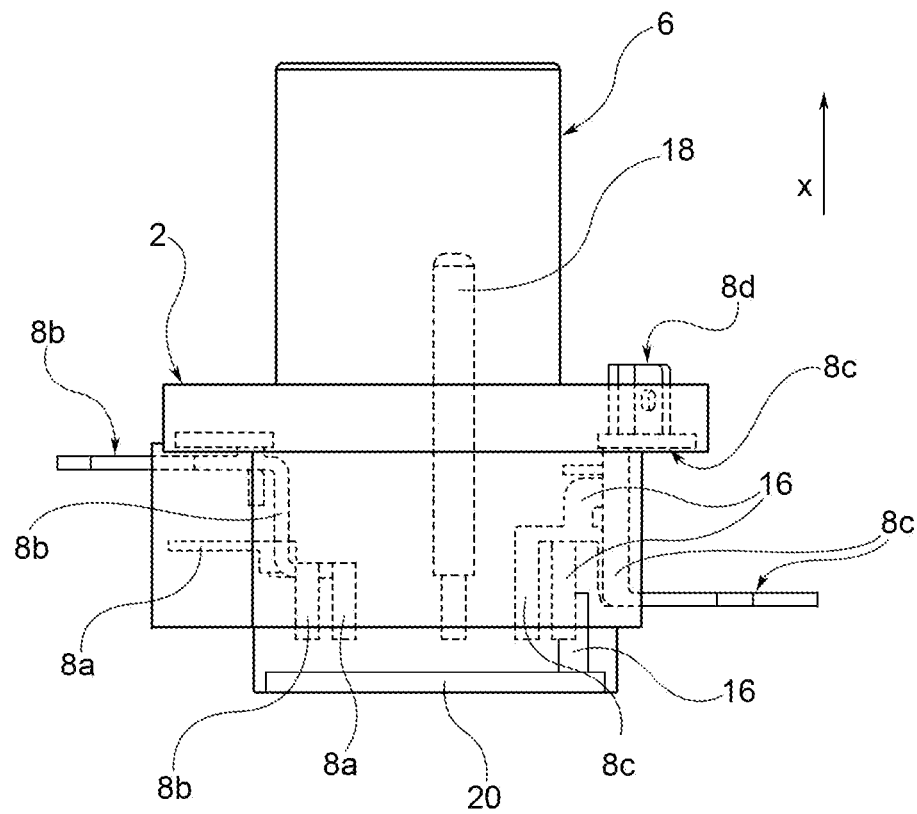
FIG. 3 is a side view of the regulator according to FIG. 1.

FIG. 3 is a side view of the regulator 1 showing the mechanical connection elements 8b, 8c and 8d and the connector 6. As can be noted, the connector 6 is arranged along a main axis X of the regulator 1, said axis X being the axis along which the casing 2 extends depthwise.

The bottom part of the regulator 1 contains a processing module 16, for example an integrated electronic circuit, which is connected to the connector 6 by means of a conductor 18 and also connected to the mechanical terminal elements 8a, 8b, 8c and 8d. The processing module 16 is designed to manage in a manner known per se the operation of the alternator 10.

A heat sink 20 fixed to said processing module 16 for example by means of an adhesive is present below the processing module 16.

The regulator 1 is assembled by first inserting the processing module 16 inside the casing 2, then fixing the heat sink 20 and finally positioning the capacitor 14 inside the secondary cavity 12. At this point, silicone is injected into the secondary cavity 12 in order to insulate the capacitor 14 and the processing module 16.

Figure 4:
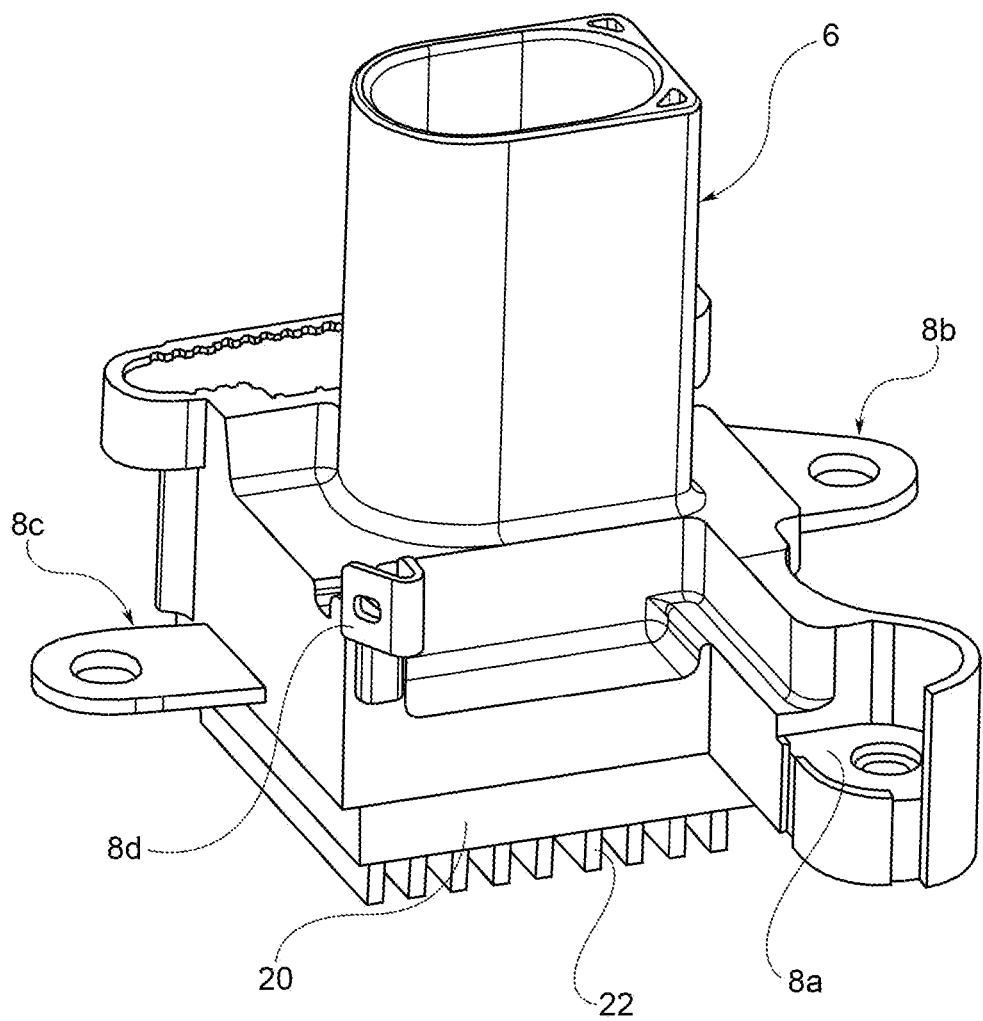
FIG. 4 is a perspective view of the regulator according to FIG. 1.

FIG. 4 is a perspective view of the regulator 1 showing the connector 6, the mechanical terminal elements 8a, 8b, 8c and 8d, the heat sink 20 and a metal support 22 (preferably made of aluminium) integral with the alternator 10 and arranged to allow fixing the regulator 1 to the alternator 10.

Figure 5:
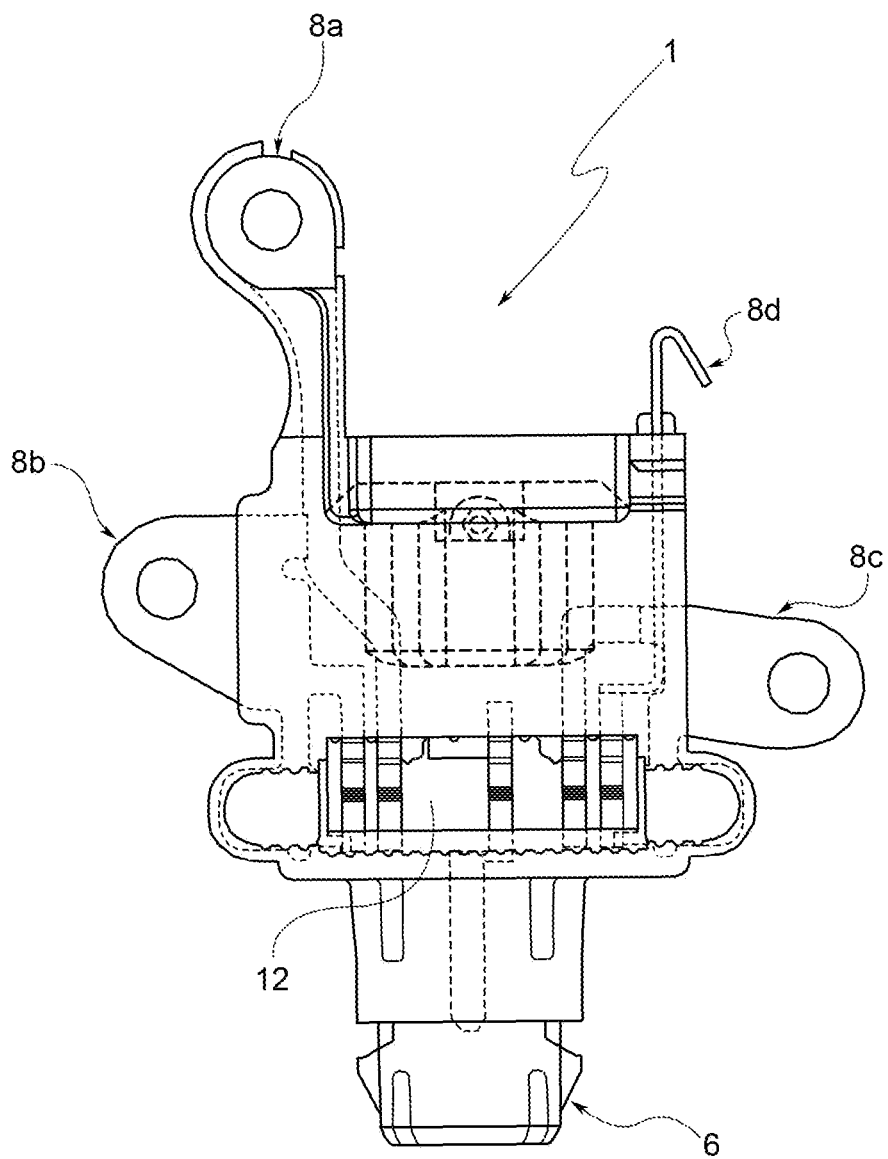
FIG. 5 is a top plan view of a variant of the voltage regulator according to FIG. 1.

FIG. 5 shows a top plan view of a variant of the regulator 1 in which the connector 6 is not positioned along the axis X, but is arranged perpendicularly with respect thereto.

Figure 6:
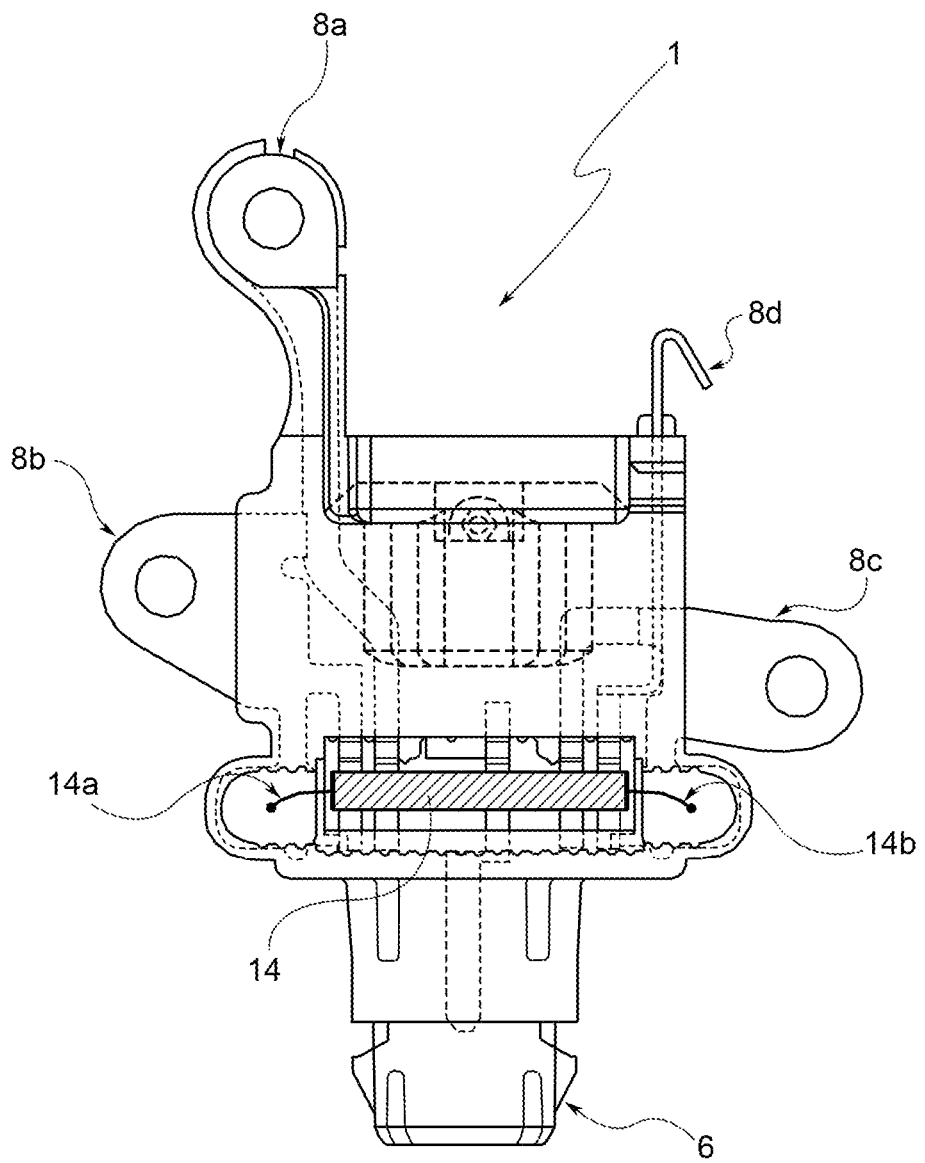
FIG. 6 is the same top plan view as in FIG. 5, comprising also the capacitor.

FIG. 6 shows the same variant as in FIG. 4, including also the capacitor 14.

Figure 7:
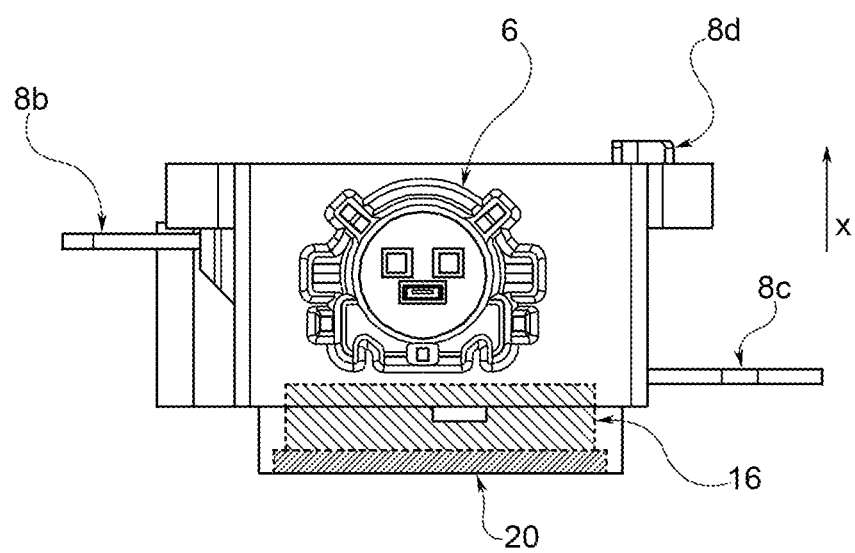
FIG. 7 is a side view of the regulator according to FIG. 5.

FIG. 7 is a side view of the variant of the regulator 1 according to FIGS. 5 and 6, showing the mechanical connection elements 8b, 8c and 8d, the connector 6, the processing module 16 and the heat sink 20. As can be noted, the connector 6 is arranged perpendicularly with respect to the axis X of the regulator 1.

FIG. 8 is a side view of the regulator 1 mounted on the alternator 10, showing the connector 6, the mechanical terminal element 8d, the heat sink 20 and the metal support 22.

Figure 9:
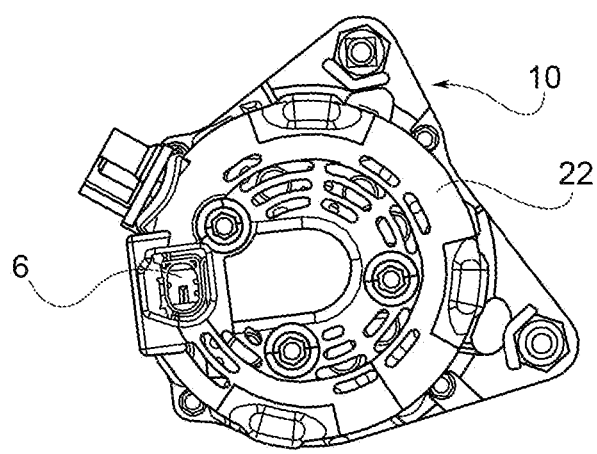
FIG. 9 is a top plan view of the regulator mounted on the alternator.

FIG. 9 is a top plan view of the regulator 1 mounted on the alternator 10, showing the connector 6.

Figure 10:
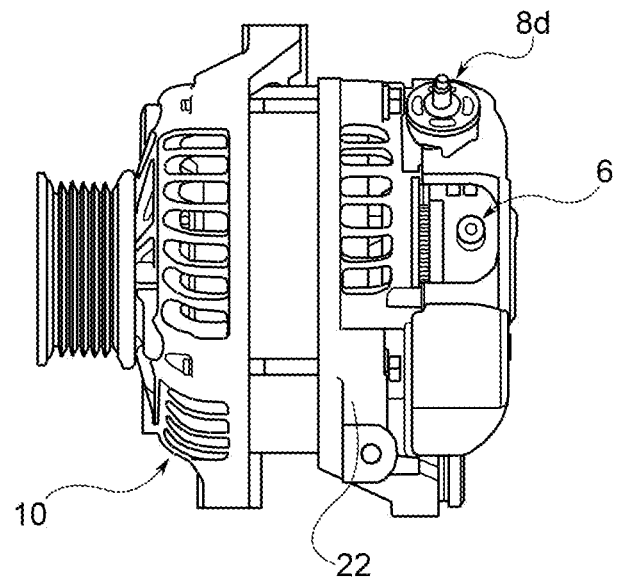
FIG. 10 is a side view of the variant of the regulator mounted on an alternator.

FIG. 10 is a side view of the variant of the regulator 1 mounted on the alternator 10, showing the connector 6.

Figure 11:
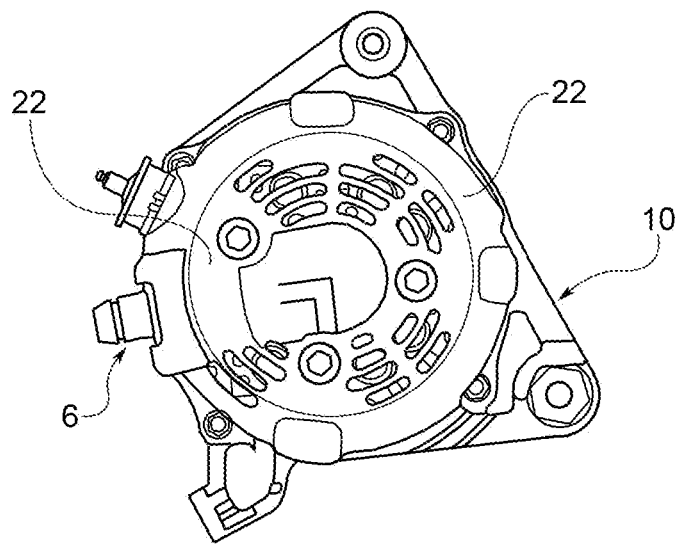
FIG. 11 is a top plan view of the variant of the regulator mounted on the alternator.

FIG. 11 is a top plan view of the variant of the regulator 1 mounted on the alternator 10.

Obviously, without affecting the principle of the invention, the embodiments and the constructional details may be greatly modified with respect to that described and illustrated purely by way of a non-limiting example, without thereby departing from the scope of the invention as defined in the accompanying claims.

The invention claimed is:

1. A voltage regulator for an alternator, comprising:
   a connector arranged to perform the function of a communication interface between the alternator and a control unit of an engine to which the alternator is connected;
   a capacitor connected to the alternator, for performing the function of anti-noise filter at radio frequencies;

a processing module connected to the alternator, for managing operation of the alternator;

a heat sink arranged to dissipate the heat of the voltage regulator;

wherein the voltage regulator comprises:

a casing arranged to be connected to the alternator, which defines a main cavity arranged to house the connector and a secondary cavity adjacent to the main cavity and arranged to house the capacitor;

the casing is able to be fixed to the alternator by means of four mechanical connection elements, two of said connection elements being connected to the capacitor, a third one of said connection elements being connected and screwed to a brush holder element of the alternator and a fourth one of said connection elements being connected to the processing module;

the processing module connected to the connector by means of a conductor and the processing module connected to the four mechanical connection elements; and the heat sink fixed to the processing module.

2. The voltage regulator according to claim 1, wherein the four mechanical connection elements are each made of conductive material.

3. The voltage regulator according to claim 2, wherein the connector is arranged along a main axis X of the voltage regulator.

4. The voltage regulator according to claim 2, wherein the connector is arranged perpendicularly with respect to a main axis X of the voltage regulator.

5. The voltage regulator according to claim 1, further comprising silicone within the secondary cavity arranged to insulate the capacitor and the processing module.

* * * * *